(12) United States Patent
Lee et al.

(10) Patent No.: US 12,082,453 B2
(45) Date of Patent: Sep. 3, 2024

(54) DISPLAY DEVICE INCLUDING A TRANSMISSION PREVENTING PATTERN

(71) Applicant: Samsung Display Co., Ltd., Yongin-Si (KR)

(72) Inventors: Junhee Lee, Hwaseong-si (KR); Minyeul Ryu, Suwon-si (KR); Beohmrock Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 362 days.

(21) Appl. No.: 17/375,397

(22) Filed: Jul. 14, 2021

(65) Prior Publication Data

US 2022/0149136 A1 May 12, 2022

(30) Foreign Application Priority Data

Nov. 12, 2020 (KR) ........................ 10-2020-0151384

(51) Int. Cl.
| | | |
|---|---|---|
| *H10K 59/126* | (2023.01) | |
| *H10K 59/121* | (2023.01) | |
| *H10K 59/122* | (2023.01) | |
| *H10K 59/38* | (2023.01) | |
| *G06F 3/041* | (2006.01) | |
| *G06F 3/044* | (2006.01) | |

(52) U.S. Cl.
CPC ....... *H10K 59/126* (2023.02); *H10K 59/1213* (2023.02); *H10K 59/122* (2023.02); *H10K 59/38* (2023.02); *G06F 3/0412* (2013.01); *G06F 3/044* (2013.01)

(58) Field of Classification Search
CPC ............... H10K 59/126; H10K 59/122; H10K 59/1213; H10K 59/38
USPC .......................................................... 257/72
See application file for complete search history.

(56) References Cited

U.S. PATENT DOCUMENTS

2020/0194719 A1* 6/2020 Choi ..................... H10K 50/844
2022/0302229 A1* 9/2022 Yue ....................... H10K 50/858

FOREIGN PATENT DOCUMENTS

| KR | 101293562 B1 | 8/2013 |
| KR | 101294260 B1 | 8/2013 |
| KR | 101899095 B1 | 10/2018 |
| KR | 101923172 B1 | 11/2018 |
| KR | 1020200072890 A | 6/2020 |

* cited by examiner

*Primary Examiner* — Xia L Cross
(74) *Attorney, Agent, or Firm* — CANTOR COLBURN LLP

(57) ABSTRACT

A display device may include a substrate including a display area, a thin film transistor disposed on the substrate, a via layer disposed on the thin film transistor, where a via hole is defined through the via layer to expose a part of the thin film transistor, a lower electrode disposed on the via layer, a pixel defining layer disposed on the via layer, where a step structure is defined in the pixel defining layer to overlap the via hole, and a transmission preventing pattern disposed on the pixel defining layer and overlapping the via hole.

15 Claims, 14 Drawing Sheets

DISPLAY DEVICE INCLUDING A TRANSMISSION PREVENTING PATTERN

This application claims priority to Korean Patent Application No. 10-2020-0151384, filed on Nov. 12, 2020, and all the benefits accruing therefrom under 35 USC § 119, the content of which in its entirety is herein incorporated by reference.

BACKGROUND

1. Field

Embodiments relate generally to a display device. More particularly, embodiments of the disclosure relate to a display device not including a polarizing plate for antireflection.

2. Description of the Related Art

A display device has desired characteristics not only in downsizing, thinning, and weight reduction, but also in low power consumption. Among the display device, a liquid crystal display is widely applied to a medium to large electronic device such as a monitor and a TV, and an organic light emitting display is widely applied to a portable electronic device such as a mobile phone.

When the display device is applied to a portable electronic device, the display device may include a display panel, a cover window, and a touch sensing structure. In such a display device, the cover window may cover the display panel to protect the display panel, and the touch sensing structure may detect a point touched by the user and convert the point into an electrical signal. In a display device where the cover window and the touch sensing structure are disposed on the display panel, an external light incident from the outside may be reflected from the cover window and the touch sensing structure, and a reflected light may be generated. Also, when the external light is reflected from an electrode included in the display panel, a reflected light may be generated.

Accordingly, such a display device may further include a polarizing plate to suppress the reflected light. In such a display device, the polarizing plate may extinguish the reflected light, such that outdoor visibility of the display device may be improved.

SUMMARY

In an display device including a polarizing plate to suppress reflected light or for antireflection, about half of a light emitted from a light emitting layer included in the display panel as well as the reflected light is absorbed by the polarizing plate, such that a light efficiency of the display device may be lowered. Accordingly, technologies capable of replacing the polarizing plate for antireflection are desired to increase the light efficiency of the display device.

Some embodiments provide a display device including a transmission preventing pattern.

According to an embodiment of the invention, a display device includes a substrate including a display area, a thin film transistor disposed on the substrate, a via layer disposed on the thin film transistor, where a via hole is defined through the via layer to expose a part of the thin film transistor, a lower electrode disposed on the via layer, a pixel defining layer disposed on the via layer, where a step structure is defined in the pixel defining layer to overlap the via hole, and a transmission preventing pattern disposed on the pixel defining layer and overlapping the via hole.

In an embodiment, the display device may further include a spacer disposed on the pixel defining layer.

In an embodiment, a thickness of the transmission preventing pattern may be different from a thickness of the spacer when viewed in a cross-sectional view. In such an embodiment, the transmission preventing pattern may fill the step structure when viewed in a cross-sectional view.

In an embodiment, an upper surface of the transmission preventing pattern and an upper surface of the spacer may be positioned at a same level as each other when viewed in a cross-sectional view. In such an embodiment, the transmission preventing pattern may fill the step structure when viewed in a cross-sectional view.

In an embodiment, the transmission preventing pattern and the spacer may include a same material as each other.

In an embodiment, each of the transmission preventing pattern and the spacer may include a carbon black.

In an embodiment, the pixel defining layer and the transmission preventing pattern may include a same material as each other.

In an embodiment, each of the pixel defining layer and the transmission preventing pattern may include a carbon black.

In an embodiment, the thin film transistor may include an active layer, a gate insulating layer disposed on the active layer, a gate electrode disposed on the gate insulating layer, an interlayer insulating layer disposed on the gate electrode, and a source electrode and a drain electrode disposed on the gate electrode.

In an embodiment, the via hole may expose a part of the drain electrode. In such an embodiment, the lower electrode may extend from an upper surface of the via layer into the via hole, and be in contact with the drain electrode.

In an embodiment, the via layer may include a first via layer disposed on the interlayer insulating layer and covering the source electrode and the drain electrode, and second via layer disposed on the first via layer.

In an embodiment, the display device may further include an emission layer disposed on the lower electrode and an upper electrode disposed on the transmission preventing pattern, the pixel definition layer, and the emission layer.

In an embodiment, the via hole and the emission layer may be spaced apart from each other.

In an embodiment, the display device may further include an encapsulation layer disposed on the upper electrode, and a black matrix disposed on the encapsulation layer. In such an embodiment, a plurality of openings may be defined through the black matrix.

In an embodiment, the display device may further include a plurality of color filters disposed in the openings of the black matrix.

In embodiments of a display device according to the invention, a transmission preventing pattern filling the step structure of the pixel defining layer corresponding to a via hole formed in the via layer may be disposed on the pixel defining layer. Accordingly, a reflected light reflected by external light from an upper surface of the lower electrode may be controlled, and a reflection color strip phenomenon may be effectively prevented.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
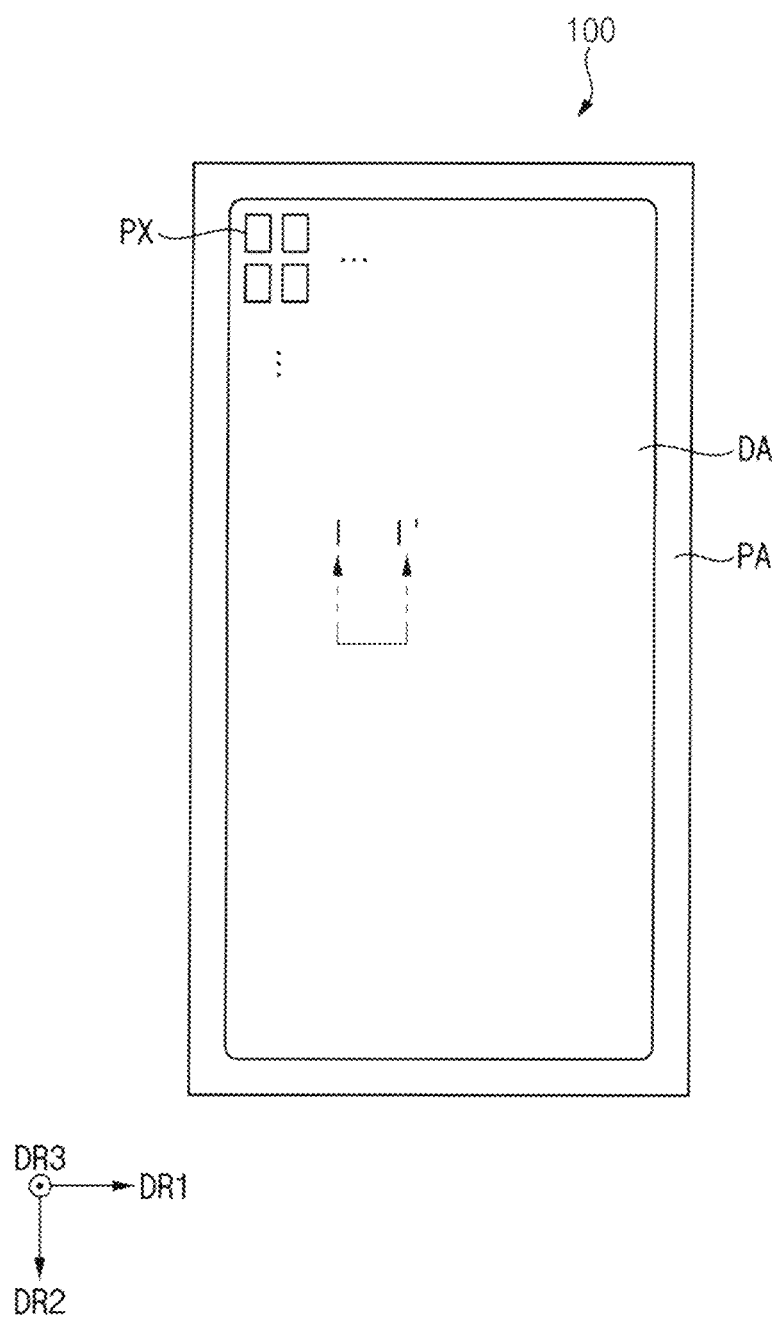
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a plan view illustrating a display device according to an embodiment.

Referring to FIG. 1, an embodiment of the display device 100 may include a display area DA and a peripheral area PA substantially surrounding the display area DA. In such an embodiment, a plurality of pixels PX (e.g., a thin film transistor TFT and an organic light emitting element OLED of FIG. 2) may be disposed in the display area PA.

One pixel PX may display one predetermined basic or primary color. In such an embodiment, one pixel PX may be a minimum unit capable of displaying a predetermined color independent from other pixels PX. The plurality of pixels PX may be arranged substantially in a matrix form along a first direction DR1 and a second DR2 orthogonal to the first direction DR1. Herein, a third direction DR3 orthogonal to the first and second directions DR1 and DR2 may be a thickness direction of the display device 100.

Figure 2:
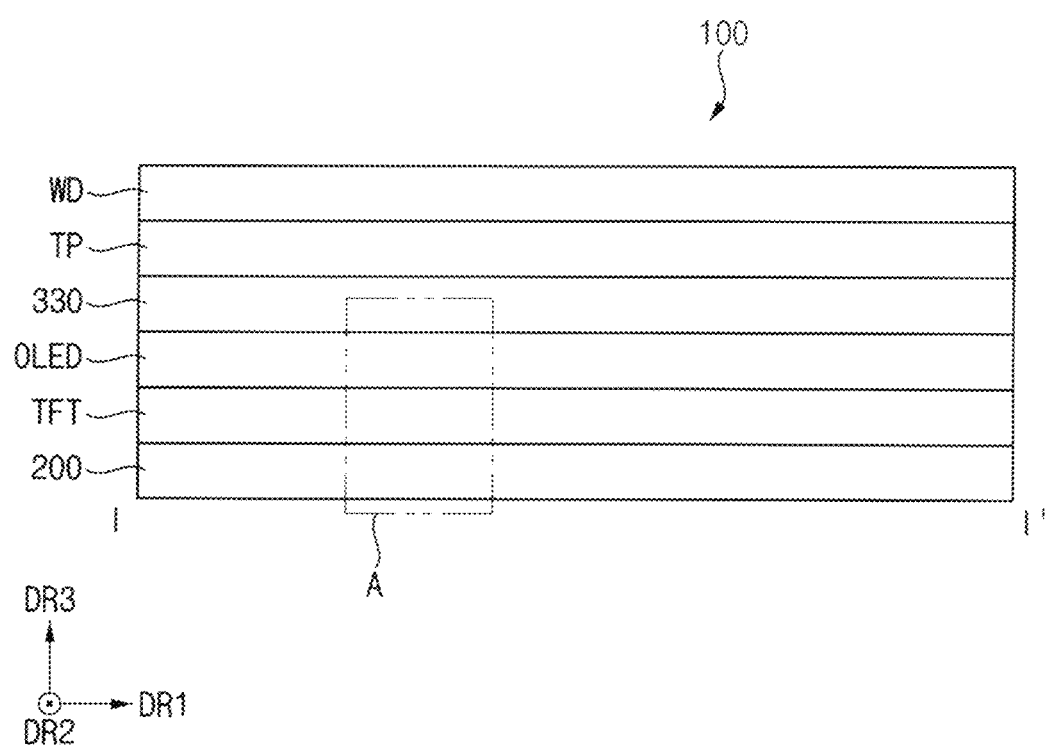
FIG. 2 is a cross-sectional view taken along line I-I' of FIG. 1.

FIG. 2 is a cross-sectional view taken along line I-I' of FIG. 1.

Referring to FIG. 2, an embodiment of the display device 100 may include a substrate 200, a thin film transistor TFT, an organic light emitting element OLED, an encapsulation layer 330, a touch sensing structure TP, a cover window WD, and the like.

The thin film transistor TFT may be disposed on the substrate 200. The substrate 200 may include a transparent or opaque material. The organic light emitting element OLED may be disposed on the thin film transistor TFT. The organic light emitting element OLED may be electrically connected to the thin film transistor TFT. The encapsulation layer 330 may be disposed on the organic light emitting element OLED.

A conventional display device may include a polarizing plate disposed on an encapsulation layer. In such a conventional display device, where the polarizing plat is disposed, about half of a light emitted from an organic light emitting element may be absorbed, such that a light efficiency of the display device may be lowered. In an embodiment of the invention, the display device 100 may not include the polarizing plate on the encapsulation layer 330.

The touch sensing structure TP may be disposed on the encapsulation layer 330. In one embodiment, for example, the touch sensing structure TP may include a transparent conductive material such as indium tin oxide ("ITO"), indium zinc oxide ("IZO"), and the like. In an embodiment, the touch sensing structure TP may be formed in a shape of a touch sensing panel and attached to the encapsulation layer 330. Alternatively, the touch sensing structure TP may be formed directly on the encapsulation layer 330.

The cover window WD may be disposed on the touch sensing structure TP. The cover window WD may serve to protect the substrate 200, the thin film transistor TFT, the encapsulation layer 330, and the touch sensing structure TP. In one embodiment, for example, the cover window WD may include at least one selected from polyethylene terephthalate, polyimide, and the like.

Figure 3:
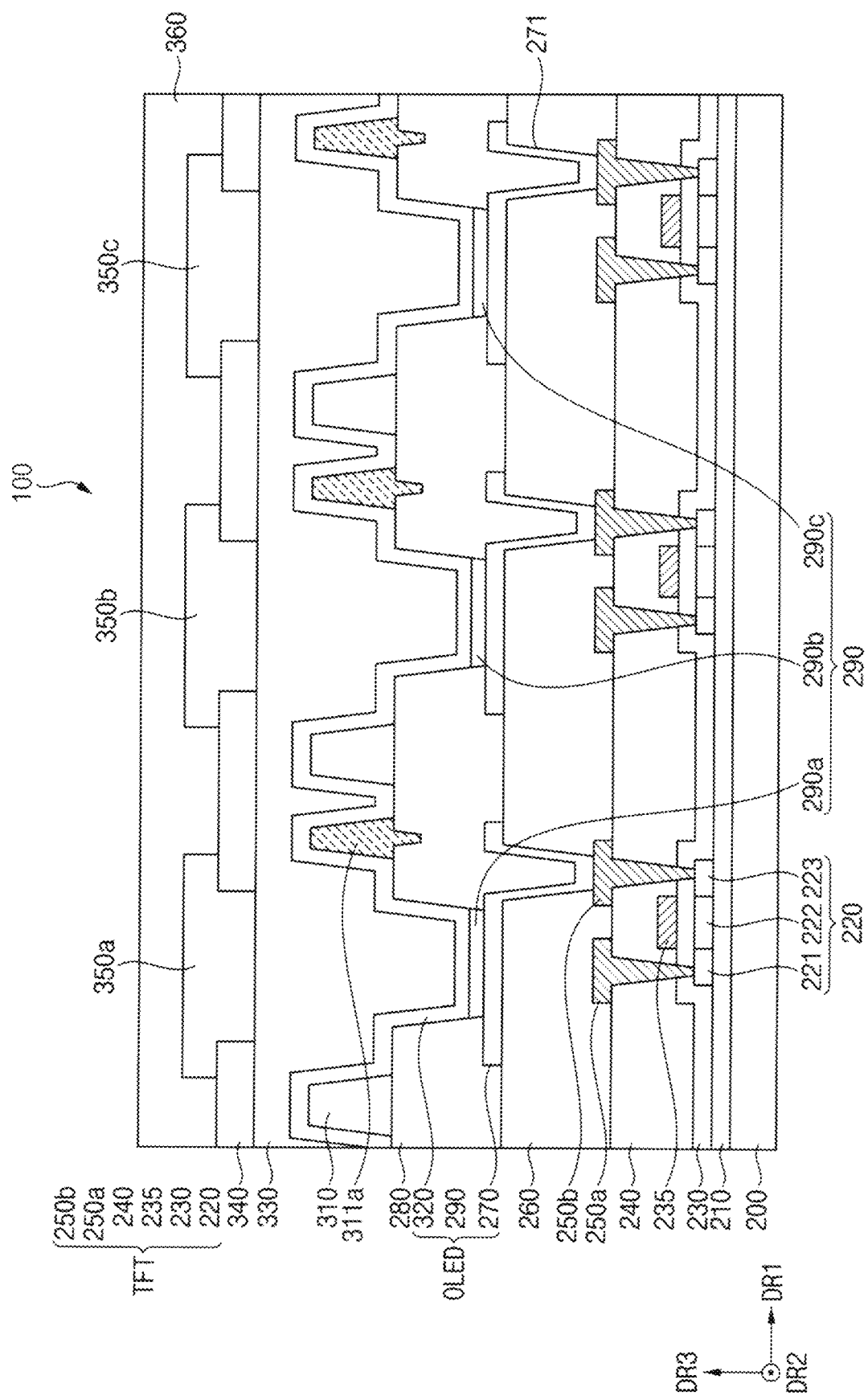
FIG. 3 is an enlarged cross-sectional view illustrating an area "A" of the display device of FIG. 2.

FIG. 3 is an enlarged cross-sectional view illustrating an area "A" of the display device of FIG. 2.

Referring to FIG. 3, an embodiment of the display device 100 may include the substrate 200, a buffer layer 210, the thin film transistor TFT, a via layer 260, a pixel defining layer 280, the organic light emitting element OLED, a spacer 310, a transmission preventing pattern 311a, the encapsulation layer 330, a black matrix 340, first to third color filters 350a, 350b, and 350c, an overcoat layer 360, and the like.

The thin film transistor TFT may include an active layer 220, a gate insulating layer 230, a gate electrode 235, an interlayer insulating layer 240, a source electrode 250a, and a drain electrode 250b. The organic light emitting element OLED may include a lower electrode 270, an emission layer 290, and an upper electrode 320.

The substrate 200 may include a transparent or opaque material. In one embodiment, for example, the substrate 200 may include plastics having high heat resistance and durability, such as polyimide, polyethylene etherphthalate, and the like. Alternatively, the substrate 200 may include at least one selected from various materials such as a glass material or a metal material.

The buffer layer 210 may be disposed on the substrate 200. In one embodiment, for example, the buffer layer 210 may include an inorganic material such as oxide or nitride. The buffer layer 210 may prevent diffusion of metal atoms or impurities from the substrate 200 to the thin film transistor TFT. In addition, when a surface of the substrate 200 is not uniform, the buffer layer 210 may serve to improve a flatness of the surface of the substrate 200.

The active layer 220 may be disposed on the buffer layer 210. The active layer 220 may include a silicon semiconductor or an oxide semiconductor. In one embodiment, for example, the active layer 220 may include a silicon semiconductor containing polysilicon. Alternatively, the active layer 220 may include at least one selected from an oxide semiconductor containing indium (In), zinc (Zn), gallium (Ga), tin (Sn), titanium (Ti), aluminum (Al), hafnium (Hf), zirconium (Zr), magnesium (Mg), and the like.

The active layer 220 may include a channel region 222, a source region 221, and a drain region 223. The source region 221 and the drain region 223 may be positioned in both opposing side portions of the channel region 222, respectively. Each of the source region 221 and the drain region 223 may be doped with impurities.

The gate insulating layer 230 may be disposed on the buffer layer 210. The gate insulating layer 230 may cover the active layer 220. In one embodiment, for example, the gate insulating layer 230 may include at least one selected from silicon oxide (SiOx), silicon nitride (SiNx), silicon oxynitride (SiOxNy), silicon oxycarbide (SiOxCy), and the like. Alternatively, the gate insulating layer 230 may include an insulating metal oxide such as aluminum oxide (AlOx), tantalum oxide (TaOx), hafnium oxide (HfOx), zirconium oxide (ZrOx), titanium oxide (TiOx), and the like.

The gate electrode 235 may be disposed on the gate insulating layer 230. The gate electrode 235 may be disposed to overlap the channel region 222 of the active layer 220 in the third direction DR3. In one embodiment, for example, the gate electrode 235 may include at least one selected from a metal such as aluminum (Al), silver (Ag), chromium (Cr), titanium (Ti), tantalum (Ta), molybdenum (Mo), and the like, alloys including the metal, nitrides including the metal, a conductive metal oxide, a transparent conductive material, and the like. In one embodiment, for example, the gate electrode 235 may have a stacked structure of a titanium film and a molybdenum film.

The interlayer insulating layer 240 may be disposed on the gate insulating layer 230. The interlayer insulating layer 240 may cover the gate electrode 235. In one embodiment, for example, the interlayer insulating layer 240 may include at least one selected from silicon oxide, silicon nitride, silicon oxynitride, silicon oxycarbide, and the like.

The source electrode 250a and the drain electrode 250b may be disposed on the interlayer insulating layer 240. Each of the source electrode 250a and the drain electrode 250b may be connected to the source region 221 and the drain region 223 through a contact hole defined through the gate insulating layer 230 and the interlayer insulating layer 240, e.g., formed by removing a part of the gate insulating layer 230 and the interlayer insulating layer 240. Accordingly, each of the source electrode 250a and the drain electrode 250b may be electrically connected to the source region 221 and the drain region 223 of the active layer 220.

The via layer 260 may be disposed on the interlayer insulating layer 240. The via layer 260 may cover the source electrode 250a and the drain electrode 250b. In one embodiment, for example, the via layer 260 may include an organic insulating material such as a phenol resin, an acrylic resin, a polyimide resin, a polyamide resin, a siloxane resin, an epoxy resin, and the like. A via hole 271 is defined through the via layer 260, e.g., by removing a part of the via layer 260, to expose a part of the drain electrode 250b.

In an embodiment, the via hole 271 may be defined or formed to be spaced apart from the emission layer 290. In such an embodiment, the via hole 271 may have a narrow width. In an embodiment, the via hole 271 may be defined or formed to be spaced apart from the emission layer 290 by about 6.5 micrometers (μm) or more. Accordingly, a reflected light caused by external light incident on an upper surface of the lower electrode 270 extending into the via hole 271 may be reduced.

The lower electrode 270 may be disposed on the via layer 260. In an embodiment, the lower electrode 270 may extend from an upper surface of the via layer 360 into the via hole 271, and may be in contact with the drain electrode 250b. Alternatively, the lower electrode 270 may fill the via hole 271, and may be in contact with the drain electrode 250b. In one embodiment, for example, the lower electrode 270 may include at least one selected from a metal, an alloy, a metal nitride, a conductive metal oxide, a transparent conductive material, and the like.

The pixel defining layer 280 may be disposed on the via layer 260 and the lower electrode 270. An opening is defined through the pixel defining layer 280 to expose at least a part of the lower electrode 270. In one embodiment, for example, the pixel defining layer 280 may include an organic insulating material. In one embodiment, for example, the pixel defining layer 280 may include a resin such as polyacrylic, polyimide, and the like. In an embodiment, the pixel defining layer 280 may include a carbon black having a high light absorption rate.

In an embodiment, when viewed in a cross-sectional view, a thickness of the pixel defining layer 280 including the carbon black may be in a range from about 1.1 μm to about 2.0 μm. Accordingly, the pixel defining layer 280 including the carbon black may reduce a reflected light caused by external light incident on the upper surface of the lower electrode 270.

In an embodiment, where a material or a part of the pixel defining layer 280 is filled in the via hole 271 defined in the via layer 260, the pixel defining layer 280 disposed at the edge of the lower electrode 270 may not maintain the pixel defining layer 280 to be in a desired thickness and a phenomenon in which the pixel defining layer 280 collapses toward the via hole 271 may occur. Accordingly, an upper surface of the pixel defining layer 280 overlapping the via hole 271 may have a step (or recess) structure.

The emission layer 290 may be disposed on the lower electrode 270 or in the opening of the pixel defining layer 280 on a portion of the lower electrode 270 exposed thereby. The emission layer 290 may include an organic emission layer, and at least one selected from a hole injection layer, a hole transport layer, an electron transport layer, an electron injection layer, and the like. In one embodiment, for example, the emission layer 290 may include a low molecular weight organic compound or a high molecular weight organic compound. In an embodiment, the emission layer 290 may include a first emission layer 290a for emitting red light, a second emission layer 290b for emitting green light, and a third emission layer 290c for emitting blue light.

The spacer 310 may be disposed on the pixel defining layer 280. In an embodiment, the spacer 310 may be provided in plural such that a plurality of spacers 310 may be disposed on the pixel defining layer 280. As will be described later, in an embodiment of a method of manufacturing the display device 100, the spacer 310 may serve to support collapse of a mask layer used when forming the light emitting layer 290.

In an embodiment, as shown in FIG. 3, the transmission preventing pattern 311a may be disposed on the pixel defining layer 280 to overlap the via hole 271. In one embodiment, for example, the transmission preventing pattern 311a may be disposed to fill the step structure of the pixel defining layer 280. Accordingly, the transmission preventing pattern 311a may reduce a reflected light caused by external light incident on the upper surface of the lower electrode 270.

In an embodiment, the pixel defining layer 280 and the transmission preventing pattern 311a may include a same material as each other. In an embodiment, each of the pixel defining layer 280 and the transmission preventing pattern 311a may include a carbon black having a high light absorption rate.

On a plan view, a shape of the transmission preventing pattern 311a and a shape of the spacer 310 may be different from each other. In an embodiment, the transmission preventing pattern 311a may have a circular shape, and the spacer 310 may have a rectangular shape. Alternatively, the shape of the transmission preventing pattern 311a and the shape of the spacer 310 may be the same as each other. However, a configuration of the invention is not limited thereto, and the shapes of the transmission preventing pattern 311a and the spacer 310 may be variously modified.

In an embodiment, a part of the spacer 310 and a part of the transmission preventing pattern 311a may be disposed to be spaced apart without contacting each other. Alternatively, the part of the spacer 310 and the part of the transmission preventing pattern 311a may be disposed in contact with each other.

In an embodiment, the transmission preventing pattern 311a and the spacer 310 may include a same material as each other. In one embodiment, for example, each of the transmission preventing pattern 311a and the spacer 310 may include polyimide. In an embodiment, each of the transmission preventing pattern 311a and the spacer 310 may further include carbon black having a high light absorption rate.

In an embodiment, when viewed in a cross-sectional view, an upper surface of the anti-transmission pattern 311a and an upper surface of the spacer 310 may be positioned at a same level as each other. Alternatively, the upper surface of the transmission preventing pattern 311a and the upper surface of the spacer 310 may be positioned at different levels from each other.

The upper electrode 320 may be disposed on the emission layer 290, the pixel defining layer 280, the transmission preventing pattern 311a, and the spacer 310. The upper electrode 320 may cover the emission layer 290, the pixel defining layer 280, the transmission preventing pattern 311a, and the spacer 310 as a whole. The upper electrode 320 may continuously extend on the display area DA shown in FIG. 1.

The encapsulation layer 330 may be disposed on the upper electrode 320. In one embodiment, for example, the encapsulation layer 330 may have a laminated structure of an inorganic thin film and an organic thin film. In an embodiment, the encapsulation layer 330 may prevent the organic light emitting element OLED from deteriorating due to penetration of moisture or oxygen. In such an embodiment, the encapsulation layer 330 may also perform a function of protecting the organic light emitting element OLED from external impact.

In one embodiment, for example, the organic thin film of the encapsulation layer 330 may include a cured polymer such as polyacrylate, epoxy resin, silicone resin, and the like. In one embodiment, for example, the inorganic thin film of the encapsulation layer 330 may include at least one selected from silicon oxide, silicon nitride, silicon carbide, aluminum oxide, tantalum oxide, hafnium oxide, zirconium oxide, titanium oxide, and the like.

The black matrix 340 may be disposed on the encapsulation layer 330. The black matrix 340 may be disposed to correspond to a non-emission area of the display device 100. In an embodiment, a plurality of openings is defined through the black matrix 340 to correspond to the emission layer 290. In one embodiment, for example, the black matrix 340 may prevent visible rays of different colors implemented in the organic light emitting element OLED from being abnormally mixed or influenced with each other. In an embodiment, the black matrix 340 may prevent members of the thin film transistor TFT from being damaged by external light.

In an embodiment, the black matrix 340 may include at least one selected from various materials. In one embodiment, for example, the black matrix 340 may include a black organic material mixed with a black pigment or chromium oxide.

The plurality of color filters 350a, 350b, and 350c may be disposed in the openings of the black matrix 340. A part of each of the plurality of color filters 350a, 350b, and 350c may overlap a part of the black matrix 340. However, the configuration of the invention is not limited thereto, and the plurality of color filters 350a, 350b, and 350c may be configured in a way such that a thickness of each of the plurality of color filters 350a, 350b, and 350c and a thickness of the black matrix 340 are the same as each other.

In one embodiment, for example, the plurality of color filters 350a, 350b, and 350c may include a coloring material and an organic material in which the coloring material is dispersed. The coloring material may be a general pigment or dye, and the organic material may be a common dispersing agent.

The plurality of color filters 350a, 350b, and 350c selectively pass only light of a specific wavelength, for example, red, green, or blue among the light emitted from the display device 100, and absorb lights of the remaining wavelengths, thereby allowing one of red, green, and blue lights to be emitted from the organic light emitting element OLED.

The plurality of color filters 350a, 350b, and 350c include the first color filter 350a that has a red color and overlaps the first emission layer 290a, the second color filter 350b that has a green color and overlaps the second emission layer 290b, and the third color filter 350c that has a blue color and overlaps the third emission layer 290c, such that a light emitted from the first, second, and third emission layers 290a, 290b, and 290c may be visually recognized as red, green, and blue colors.

The overcoat layer 360 may be disposed on the plurality of color filters 350a, 350b, and 350c. The overcoat layer 360 may cover the plurality of color filters 350a, 350b, and 350c. The overcoat layer 360 may prevent the plurality of color filters 350a, 350b, and 350c from being exposed from external moisture or air. In addition, the overcoat layer 360 may function as a planarization layer. In one embodiment, for example, the overcoat layer 360 may include an organic material or an inorganic material.

Although not shown in FIG. 3, the touch sensing structure TP shown in FIG. 2 may be disposed on the overcoat layer 360, and the cover window WD may be disposed on the touch sensing structure TP.

In a conventional display device, a step structure may be formed on an upper surface of a pixel defining layer due to a via hole formed in the via layer. Due to the pixel defining layer having the step structure, a reflected light caused by external light incident on the upper surface of the lower electrode may not be effectively controlled, and a reflective color strip phenomenon may occur in the display device.

In an embodiment of the display device 100 according to the invention, the transmission preventing pattern 311a may be disposed on the upper surface of the pixel defining layer 280 to overlap the via hole 271 while filling the step structure or recessed portion of the pixel defining layer 280. Accordingly, in such an embodiment, a reflected light caused by external light incident on the upper surface of the lower electrode 270 may be substantially reduced, and a reflection color strip phenomenon may be effectively prevented from occurring in the display device 100.

Figure 4:
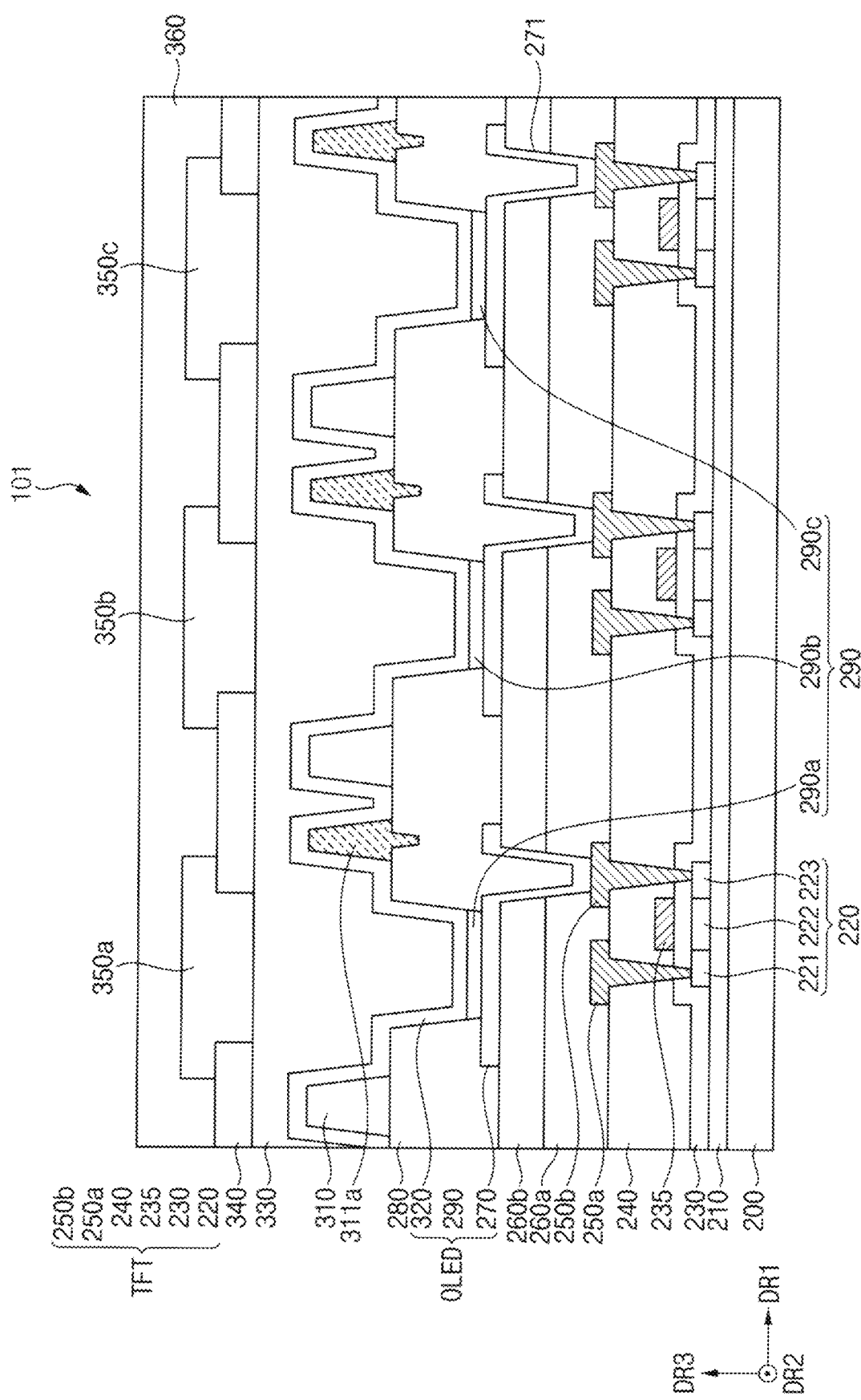
FIG. 4 is a cross-sectional view illustrating a display device according to an alternative embodiment.

FIG. 4 is a cross-sectional view illustrating a display device according to an alternative embodiment.

Referring to FIG. 4, an embodiment of the display device 101 may include the substrate 200, the buffer layer 210, the thin film transistor TFT, a first via layer 260a, a second via layer 260b, the pixel defining layer 280, the organic light emitting element OLED, the spacer 310, the transmission preventing pattern 311a, the encapsulation layer 330, the black matrix 340, the first to third color filters 350a, 350b, and 350c, the overcoat layer 360, and the like. The thin film transistor TFT may include the active layer 220, the gate insulating layer 230, the gate electrode 235, the interlayer insulating layer 240, the source electrode 250a, and the drain electrode 250b. The organic light emitting element OLED may include a lower electrode 270, the emission layer 290, and the upper electrode 320.

The display device 101 shown in FIG. 4 may be substantially the same as the display device 100 described above with reference to FIG. 3 except that the via layer includes the first via layer 260a and the second via layer 260b. The same or like elements shown in FIG. 4 have been labeled with the same reference characters as used above to describe the embodiment of the display device 100 shown in FIG. 3, and any repetitive detailed description thereof will hereinafter be omitted or simplified. Hereinafter, the first via layer 260a and the second via layer 260b will be mainly described.

The via layer may be disposed on the interlayer insulating layer 240. In such an embodiment, the via layer may include the first via layer 260a and the second via layer 260b. The first via layer 260a may be disposed on the interlayer insulating layer 240. The first via layer 260a may cover the source electrode 250a and the drain electrode 250b. The second via layer 260b may be disposed on the first via layer 260a. However, the configuration of the invention is not limited thereto. In one alternative embodiment, for example, the via layer may further include a third via layer disposed on the second via layer 260b. In such an embodiment, the via layer includes the first via layer 260a and the second via layer 260b, such that the upper surface of the lower electrode 270 may be flat. Accordingly, asymmetric reflection due to external light on the upper surface of the lower electrode 270 may be effectively prevented.

In one embodiment, for example, each of the first via layer 260a and the second via layer 260b may include an organic insulating material such as phenol resin, acrylic resin, polyimide resin, polyamide resin, siloxane resin, epoxy resin, and the like.

In an embodiment of the display device 100 of the invention, the transmission preventing pattern 311a may be disposed on the pixel defining layer 280 to overlap the via hole 271 defined or formed in the via layer 260 to fill the step structure defined or formed in the upper surface of the pixel defining layer 280. In such an embodiment, the via layer 260 may include the first via layer 261 and the second via layer 262 to prevent asymmetric reflection due to external light on the upper surface of the lower electrode 270. Accordingly, a reflected light caused by external light incident on the upper surface of the lower electrode 270 may be substantially reduced, and a reflective color strip phenomenon may be effectively prevented from occurring in the display device 101.

Figure 5:
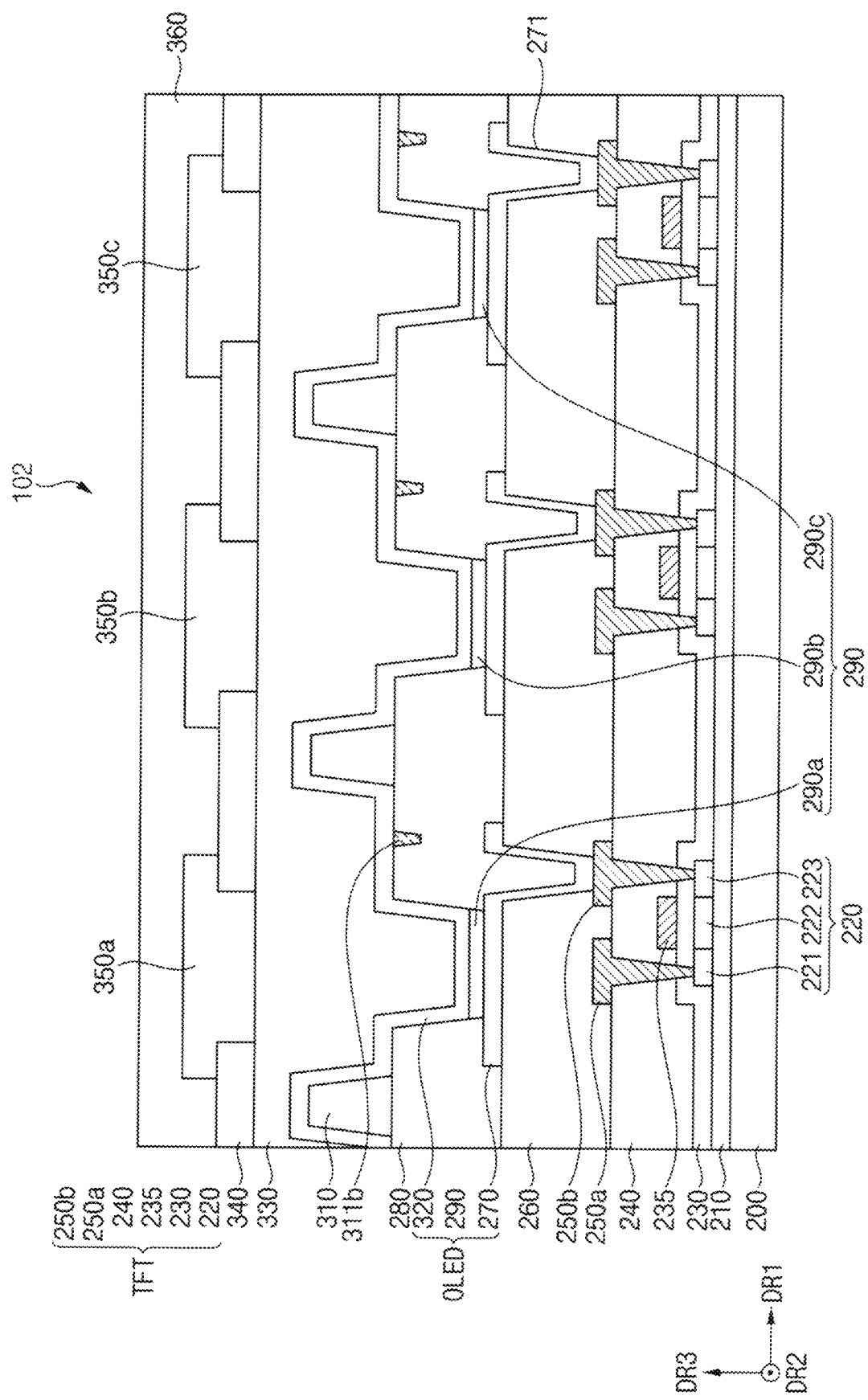
FIG. 5 is a cross-sectional view illustrating a display device according to another alternative embodiment.

FIG. 5 is a cross-sectional view illustrating a display device according to another alternative embodiment.

Referring to FIG. 5, an embodiment of the display device 102 may include the substrate 200, the buffer layer 210, the thin film transistor TFT, the via layer 260, the pixel defining layer 280, the organic light emitting element OLED, the spacer 310, a transmission preventing pattern 311b, the encapsulation layer 330, the black matrix 340, the first to third color filters 350a, 350b, and 350c, the overcoat layer 360, and the like. The thin film transistor TFT may include the active layer 220, the gate insulating layer 230, the gate electrode 235, the interlayer insulating layer 240, the source electrode 250a, and the drain electrode 250b. The organic light emitting element OLED may include the lower electrode 270, the emission layer 290, and the upper electrode 320.

The display device 102 may be substantially the same as the display device 100 described above with reference to FIG. 3 except for the transmission preventing pattern 311b. The same or like elements shown in FIG. 5 have been labeled with the same reference characters as used above to describe the embodiment of the display device 100 shown in FIG. 3, and any repetitive detailed description thereof will hereinafter be omitted or simplified. Hereinafter, the transmission preventing pattern 311b will be mainly described.

In an embodiment, the spacer 310 may be disposed on the pixel defining layer 280. In an embodiment, the plurality of spacers 310 may be disposed on the pixel defining layer 280. In an embodiment of the manufacturing method of the display device 100, the spacer 310 may serve to support collapse of a mask layer used when forming the emission layer 290.

In an embodiment, the transmission preventing pattern 311b overlapping the via hole 271 may be disposed on the pixel defining layer 280. In one embodiment, for example, the transmission preventing pattern 311b may be disposed to fill the step structure of the pixel defining layer 280. Accordingly, the transmission preventing pattern 311b may reduce a reflected light caused by external light incident on the upper surface of the lower electrode 270.

On a plan view, a shape of the transmission preventing pattern 311b and a shape of the spacer 310 may be different from each other. In one embodiment, for example, the transmission preventing pattern 311b may have a circular shape, and the spacer 310 may have a rectangular shape. Alternatively, the shape of the transmission preventing pattern 311b and the shape of the spacer 310 may be the same as each other. However, the configuration of the invention is not limited thereto, and the shapes of the transmission preventing pattern 311b and the spacer 310 may be variously modified.

In an embodiment, a part of the spacer 310 and a part of the transmission preventing pattern 311b may be disposed to be spaced apart without contacting each other. Alternatively, the part of the spacer 310 and the part of the transmission preventing pattern 311b may be disposed in contact with each other.

In an embodiment, the transmission preventing pattern 311b and the spacer 310 may include a same material as each other. In one embodiment, for example, each of the transmission preventing pattern 311b and the spacer 310 may include polyimide. In an embodiment, each of the transmission preventing pattern 311b and the spacer 310 may further include a carbon black having a high light absorption rate.

In an embodiment, when viewed in a cross-sectional view, a thickness of the transmission preventing pattern 311b and a thickness of the spacer 310 may be different from each other. In one embodiment, for example, the thickness of the transmission preventing pattern 311b may be smaller than the thickness of the spacer 310. In an embodiment, the transmission preventing pattern 311b may be leveled while filling the step structure defined or formed in the pixel defining layer 280. In one embodiment, for example, the level of the upper surface of the pixel defining layer 280 and the level of the upper surface of the transmission preventing pattern 311b may be the same as each other.

In an embodiment of the display device 102 according to the invention, the transmission preventing pattern 311b may be disposed on the pixel defining layer 280 to overlap the via hole 271 formed in the via layer 260 to fill the step structure defined in the upper surface of the pixel defining layer 280. Accordingly, a reflected light caused by external light incident on the upper surface of the lower electrode 270 may be substantially reduced, and a reflective color strip phenomenon may be effectively prevented from occurring in the display device 102.

Figure 6:
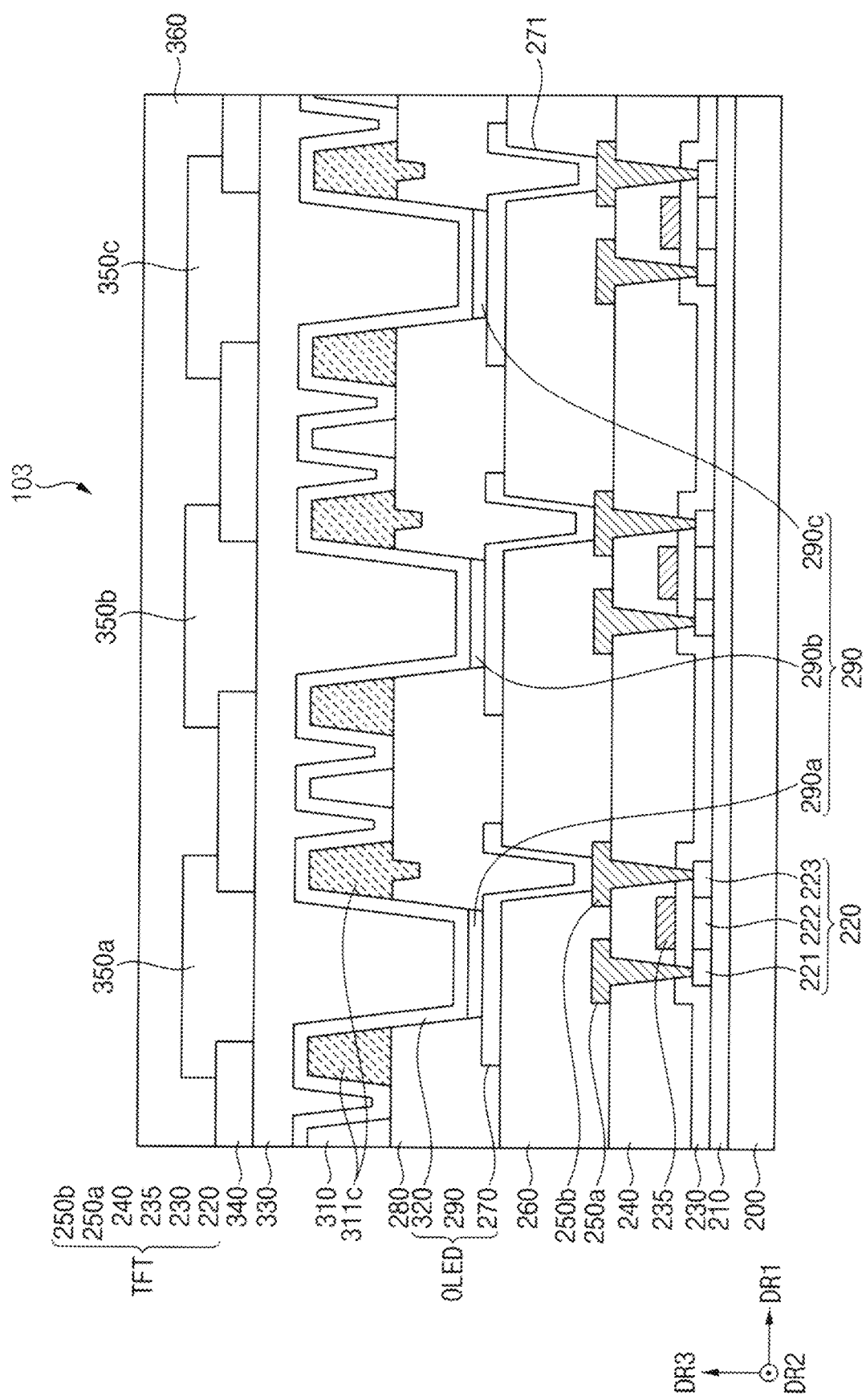
FIG. 6 is a cross-sectional view illustrating a display device according to still another alternative embodiment.

FIG. 6 is a cross-sectional view illustrating a display device according to still another alternative embodiment.

Referring to FIG. 6, an embodiment of the display device 103 may include the substrate 200, the buffer layer 210, the thin film transistor TFT, the via layer 260, the pixel defining layer 280, the organic light emitting element OLED, the spacer 310, a transmission preventing pattern 311c, the encapsulation layer 330, the black matrix 340, the first to third color filters 350a, 350b, and 350c, the overcoat layer 360, and the like. The thin film transistor TFT may include the active layer 220, the gate insulating layer 230, the gate electrode 235, the interlayer insulating layer 240, the source electrode 250a, and the drain electrode 250b. The organic light emitting element OLED may include the lower electrode 270, the emission layer 290, and the upper electrode 320.

The display device 103 may be substantially the same as the display device 100 described above with reference to FIG. 3 except for the transmission preventing pattern 311c. The same or like elements shown in FIG. 6 have been labeled with the same reference characters as used above to describe the embodiment of the display device 100 shown in FIG. 3, and any repetitive detailed description thereof will hereinafter be omitted or simplified. Hereinafter, the transmission preventing pattern 311c will be mainly described.

In an embodiment, the spacer 310 may be disposed on the pixel defining layer 280. In an embodiment, the spacer 310 may be provided in plural, and a plurality of spacer 310 may be disposed on the pixel defining layer 280.

In an embodiment, the transmission preventing pattern 311c overlapping the via hole 271 may be disposed on the pixel defining layer 280. In one embodiment, for example, the transmission preventing pattern 311c may be disposed to fill a step structure of the pixel defining layer 280. In an embodiment, the transmission preventing pattern 311c may be disposed on the pixel defining layer 280 to overlap the lower electrode 270. In such an embodiment, the transmission preventing pattern 311c may be disposed on the pixel defining layer 280 to overlap the lower electrode 270 adjacent to a side surface of the pixel defining layer 280. Accordingly, the transmission preventing pattern 311c may reduce a reflected light caused by external light incident on the upper surface of the lower electrode 270.

In an embodiment, the transmission preventing pattern 311c and the spacer 310 may include a same material as each other. In one embodiment, for example, each of the transmission preventing pattern 311c and the spacer 310 may include polyimide. In an embodiment, each of the transmission preventing pattern 311c and the spacer 310 may further include a carbon black having a high light absorption rate.

In an embodiment, when viewed in a cross-sectional view, the upper surface of the transmission preventing pattern 311c and the upper surface of the spacer 310 may be positioned at a same level as each other. Alternatively, the upper surface of the transmission preventing pattern 311c and the upper surface of the spacer 310 may be positioned at different levels from each other.

In an embodiment, when viewed in a cross-sectional view, the thickness of the transmission preventing pattern 311c and the thickness of the pixel defining layer 280 may be the same as each other. In one embodiment, for example, the thickness of the transmission preventing pattern 311c and the thickness of the pixel defining layer 280 may be about 1.5 μm, respectively. Alternatively, the thickness of the transmission preventing pattern 311c and the thickness of the pixel defining layer 280 may be different from each other.

In an embodiment of the display device 103 according to the invention, the transmission preventing pattern 311c may be disposed on the pixel defining layer 280 to overlap the lower electrode 270. Accordingly, a reflected light caused by external light incident on the upper surface of the lower electrode 270 may be substantially reduced, and a reflective color strip phenomenon may be effectively prevented from occurring in the display device 103.

Figure 7:
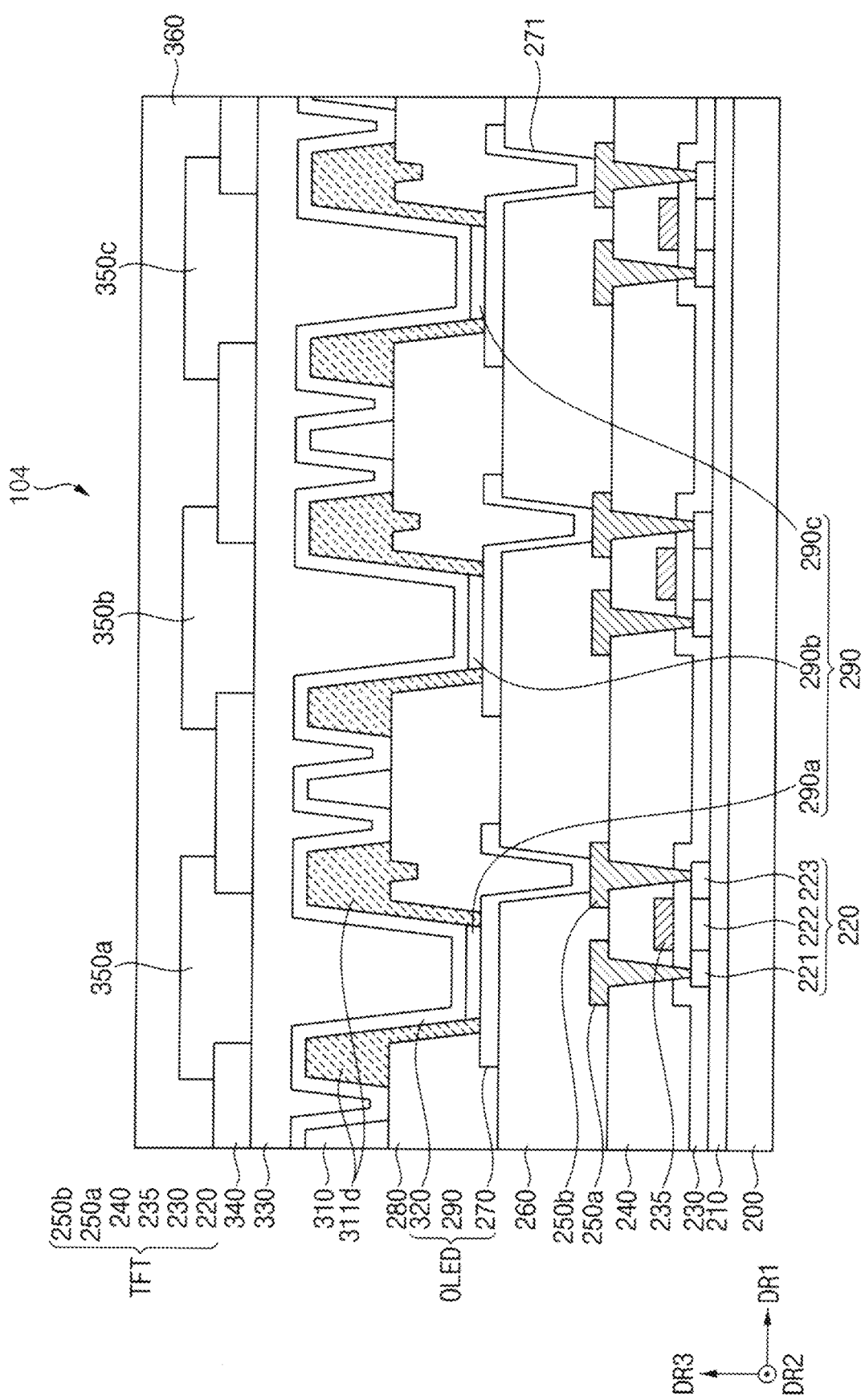
FIG. 7 is a cross-sectional view illustrating a display device according to further still another alternative embodiment.

FIG. 7 is a cross-sectional view illustrating a display device according to further still another alternative embodiment.

Referring to FIG. 7, an embodiment of the display device 104 may include the substrate 200, the buffer layer 210, the thin film transistor TFT, the via layer 260, the pixel defining layer 280, the organic light emitting element OLED, the spacer 310, a transmission preventing pattern 311d, the encapsulation layer 330, the black matrix 340, the first to third color filters 350a, 350b, and 350c, the overcoat layer 360, and the like. The thin film transistor TFT may include the active layer 220, the gate insulating layer 230, the gate electrode 235, the interlayer insulating layer 240, the source electrode 250a, and the drain electrode 250b. The organic light emitting element OLED may include the lower electrode 270, the emission layer 290, and the upper electrode 320.

The display device 104 may be substantially the same as the display device 100 described above with reference to FIG. 3 except for the transmission preventing pattern 311d. The same or like elements shown in FIG. 7 have been labeled with the same reference characters as used above to describe the embodiment of the display device 100 shown in FIG. 3, and any repetitive detailed description thereof will hereinafter be omitted or simplified. Hereinafter, the transmission preventing pattern 311d will be mainly described.

In an embodiment, the spacer 310 may be disposed on the pixel defining layer 280. In an embodiment, the spacer 310 may be provided in plural, and a plurality of spacers 310 may be disposed on the pixel defining layer 280.

In an embodiment, the transmission preventing pattern 311d overlapping the via hole 271 may be disposed on the pixel defining layer 280. In one embodiment, for example, the transmission preventing pattern 311d may be disposed to fill the step of the pixel defining layer 280. In an embodiment, the transmission preventing pattern 311d may be disposed on the pixel defining layer 280 to overlap the lower electrode 270. In such an embodiment, the transmission preventing pattern 311d may be disposed on the pixel defining layer 280 to overlap the lower electrode 270 adjacent to the side surface of the pixel defining layer 280.

In an embodiment, the transmission preventing pattern 311d may cover the side surface of the pixel defining layer 280. In one embodiment, for example, the transmission preventing pattern 311d may entirely cover the side surface of the pixel defining layer 280. Accordingly, the transmission preventing pattern 311d may reduce a reflected light caused by external light incident on the upper surface of the lower electrode 270.

In an embodiment, the transmission preventing pattern 311d and the spacer 310 may include a same material as each other. In one embodiment, for example, each of the transmission preventing pattern 311d and the spacer 310 may include polyimide. In an embodiment, each of the transmission preventing pattern 311d and the spacer 310 may further include a carbon black having a high light absorption rate.

In an embodiment, when viewed in a cross-sectional view, the upper surface of the transmission preventing pattern 311d and the upper surface of the spacer 310 may be positioned at a same level as each other. Alternatively, the upper surface of the transmission preventing pattern 311d and the upper surface of the spacer 310 may be positioned at different levels from each other.

In an embodiment, when viewed in a cross-sectional view, the thickness of the transmission preventing pattern 311d and the thickness of the pixel defining layer 280 may be the same as each other. In one embodiment, for example, the thickness of the transmission preventing pattern 311d and the thickness of the pixel defining layer 280 may be about 1.5 μm, respectively. Alternatively, the thickness of the transmission preventing pattern 311d and the thickness of the pixel defining layer may be different from each other.

In an embodiment of the display device 104 according to the invention, the transmission preventing pattern 311d may be disposed on the pixel defining layer 280 so as to overlap the lower electrode 270. In such an embodiment, the transmission preventing pattern 311d may entirely cover the side surface of the pixel defining layer 280. Accordingly, a reflected light caused by external light incident on the upper surface of the lower electrode 270 may be substantially reduced, and a reflective color strip phenomenon may be effectively prevented from occurring in the display device 104.

Figure 8:
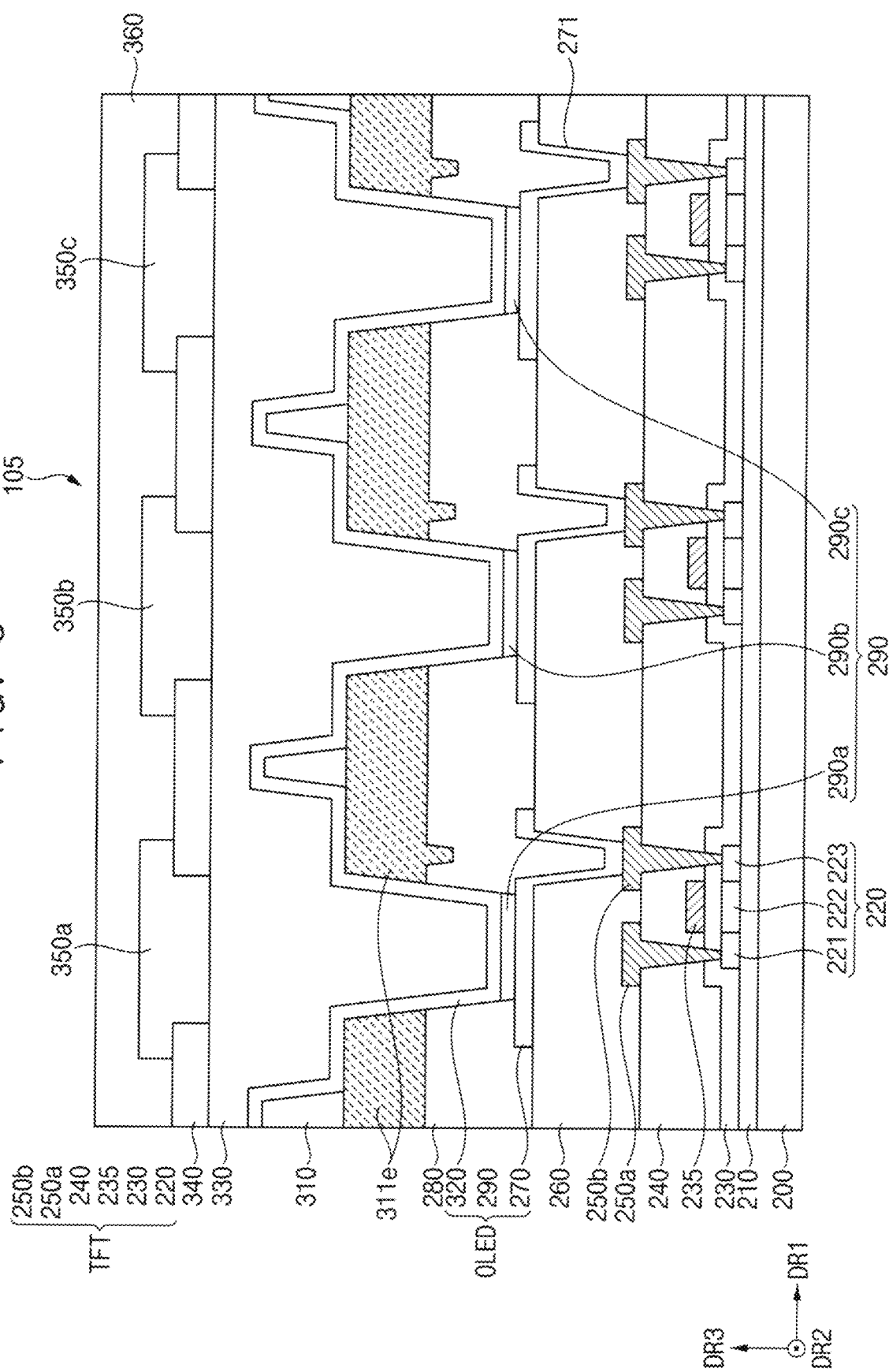
FIG. 8 is a cross-sectional view illustrating a display device according to further still another alternative embodiment.

FIG. 8 is a cross-sectional view illustrating a display device according to further still another alternative embodiment.

Referring to FIG. 8, an embodiment of the display device 10 may include the substrate 200, the buffer layer 210, the thin film transistor TFT, the via layer 260, the pixel defining layer 280, the organic light emitting element OLED, the spacer 310, a transmission preventing pattern 311e, the encapsulation layer 330, the black matrix 340, the first to third color filters 350a, 350b, and 350c, the overcoat layer 360, and the like. The thin film transistor TFT may include the active layer 220, the gate insulating layer 230, the gate electrode 235, the interlayer insulating layer 240, the source electrode 250a, and the drain electrode 250b. The organic light emitting element OLED may include the lower electrode 270, the emission layer 290, and the upper electrode 320.

The display device 105 may be substantially the same as the display device 100 described above with reference to FIG. 3 except for the transmission preventing pattern 311e. The same or like elements shown in FIG. 8 have been labeled with the same reference characters as used above to describe the embodiment of the display device 100 shown in FIG. 3, and any repetitive detailed description thereof will hereinafter be omitted or simplified. Hereinafter, the transmission preventing pattern 311e will be mainly described.

In an embodiment, the transmission preventing pattern 311e overlapping the via hole 271 may be disposed on the pixel defining layer 280. In one embodiment, for example, the transmission preventing pattern 311e may be disposed to fill the step of the pixel defining layer 280. In such an embodiment, the transmission preventing pattern 311e may be disposed entirely on the pixel defining layer 280. In such an embodiment, the transmission preventing pattern 311e may contact the upper surface of the pixel defining layer 280. In such an embodiment, the transmission preventing pattern 311e may cover an entire portion of the upper surface of the pixel defining layer 280. Accordingly, the transmission preventing pattern 311e may reduce a reflected light caused by external light incident on the upper surface of the lower electrode 270

In an embodiment, the spacer 310 may be disposed on the transmission preventing pattern 311e. In an embodiment, the space 310 may be provided in plural and a plurality of spacers 310 may be disposed on the transmission preventing pattern 311e.

In an embodiment, the transmission preventing pattern 311e and the spacer 310 may include a same material as each other. In one embodiment, for example, each of the transmission preventing pattern 311e and the spacer 310 may include polyimide. In an embodiment, each of the transmission preventing pattern 311e and the spacer 310 may further include a carbon black having a high light absorption rate.

In an embodiment, when viewed in a cross-sectional view, the thickness of the transmission preventing pattern 311e and the thickness of the pixel defining layer 280 may be the same as each other. In one embodiment, for example, the thickness of the transmission preventing pattern 311e and the thickness of the pixel defining layer 280 may be about 1.5 μm, respectively. Alternatively, the thickness of the transmission preventing pattern 311e and the thickness of the pixel defining layer 280 may be different from each other.

In an embodiment of the display device 105 according to the invention, the transmission preventing pattern 311e may be disposed entirely on the pixel defining layer 280. Accordingly, a reflected light caused by external light incident on the upper surface of the lower electrode 270 may be substantially reduced, and a reflective color strip phenomenon may be effectively prevented from occurring in the display device 105.

FIGS. 9, 10, 11, 12, 13, and 14 are cross-sectional views illustrating a method of manufacturing a display device according to an embodiment.

Figure 9:
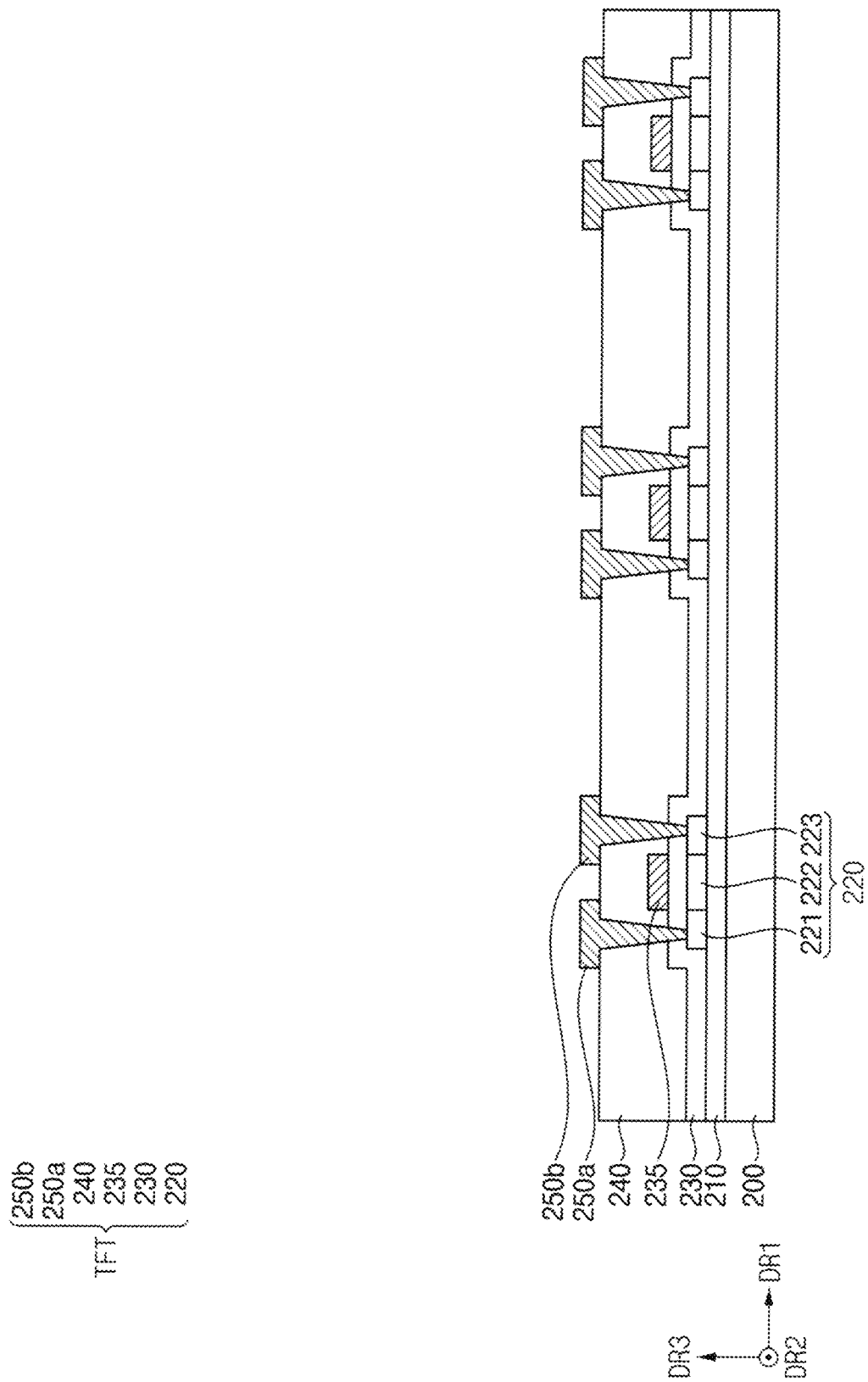
FIGS. 9, 10, 11, 12, 13, and 14 are cross-sectional views illustrating a method of manufacturing a display device according to an embodiment.

Referring to FIG. 9, in an embodiment of a method of manufacturing a display device, the buffer layer 210 may be provided or formed on the substrate 200. The buffer layer 210 may prevent diffusion of metal atoms or impurities into the thin film transistor TFT. In one embodiment, for example, the buffer layer 210 may be formed using at least one selected from a silicon compound, a metal oxide, and the like. The buffer layer 210 may be formed in a single layer structure or a multilayer structure.

The active layer 220 may be provided or formed on the buffer layer 210. The active layer 220 may be formed using a silicon semiconductor or an oxide semiconductor. In one embodiment, for example, the active layer 220 may be formed using polysilicon. In one embodiment, for example, after forming an amorphous silicon layer on the buffer layer 210, the amorphous silicon layer may be crystallized to form a polycrystalline silicon layer.

The gate insulating layer 230 may be provided or formed on the buffer layer 210. In one embodiment, for example, the gate insulating layer 230 may be formed using at least one selected from a silicon compound, a metal oxide, and the like.

The gate electrode 235 may be provided or formed on the gate insulating layer 230. The gate electrode 235 may be formed to overlap the channel region 222 of the active layer 220. In one embodiment, for example, the gate electrode 235 may be formed using at least one selected from a metal, an alloy, a metal nitride, a conductive metal oxide, a transparent conductive material, and the like.

The interlayer insulating layer 240 may be provided or formed on the gate insulating layer 230. The interlayer insulating layer 240 may be formed to cover the gate electrode 235. In one embodiment, for example, the interlayer insulating layer 240 may be formed using at least one selected from a silicon compound, a metal oxide, and the like.

A contact hole may be formed to expose parts of the source region 221 and the drain region 223 of the active layer 220 by removing parts of the gate insulating layer 230 and the interlayer insulating layer 240. The source electrode 250a and the drain electrode 250b may be provided or formed on the interlayer insulating layer 240 to fill the contact hole. Each of the source electrode 250a and the drain electrode 250b may be electrically connected to the source region 221 and the drain region 223 of the active layer 220 through the contact hole.

Figure 10:
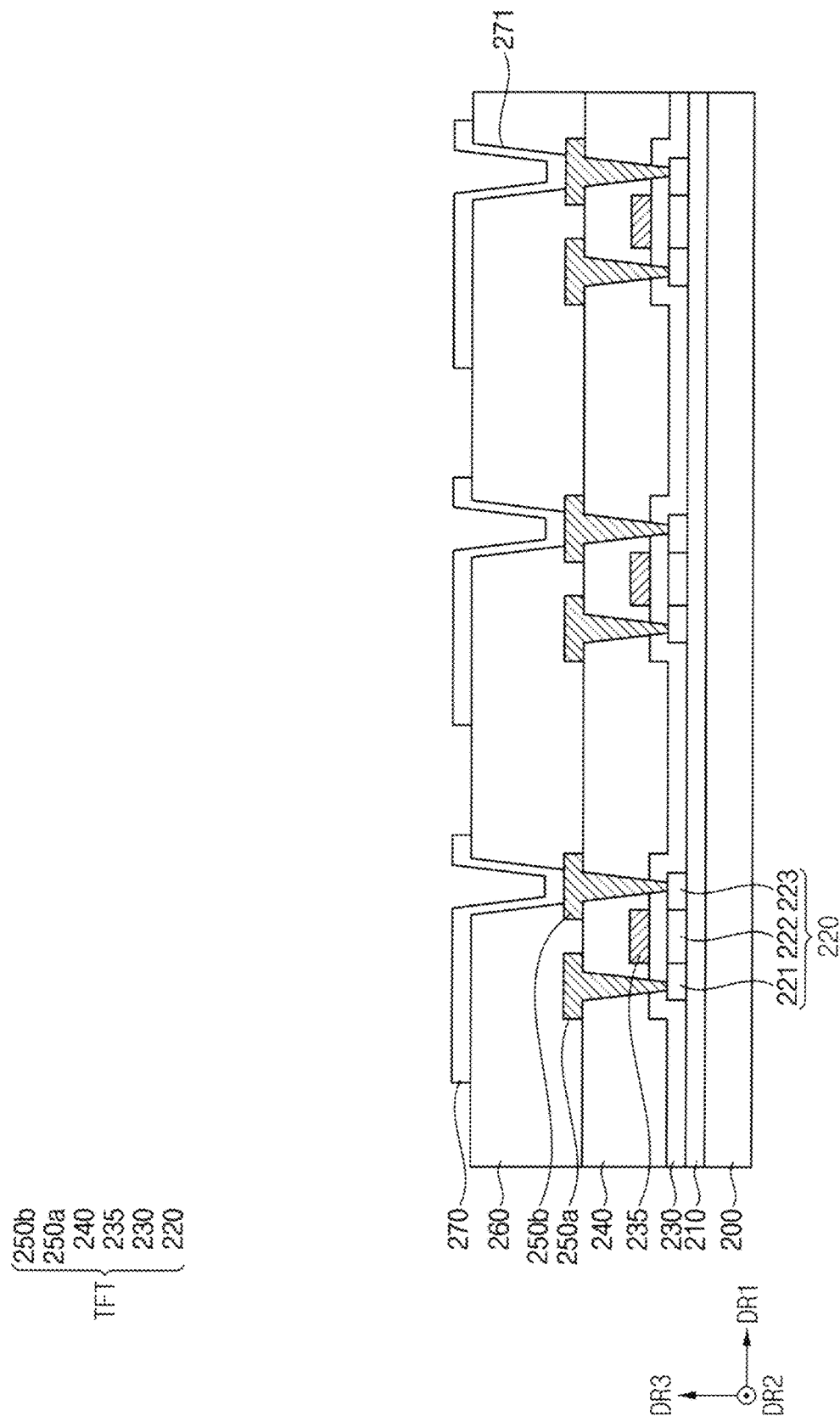

Referring to FIG. 10, the via layer 260 may be provided or formed on the interlayer insulating layer 240. The via layer 260 may be formed to cover the source electrode 250a and the drain electrode 250b. In one embodiment, for example, the via layer 260 may be formed using an organic insulating material such as a phenol resin, an acrylic resin, a polyimide resin, a polyamide resin, a siloxane resin, an epoxy resin, and the like.

The via hole 271 exposing a part of the drain electrode 250b may be formed by removing a part of the via layer 260. In an embodiment, the lower electrode 270 may be provided or formed on the via layer 260 to extend from an upper surface of the via layer 360 into to the via hole 271. Alternatively, the lower electrode 270 may be formed while filling the via hole 271 on the via layer 260. The lower electrode 270 may be electrically connected to the drain electrode 250b through the via hole 271.

Figure 11:
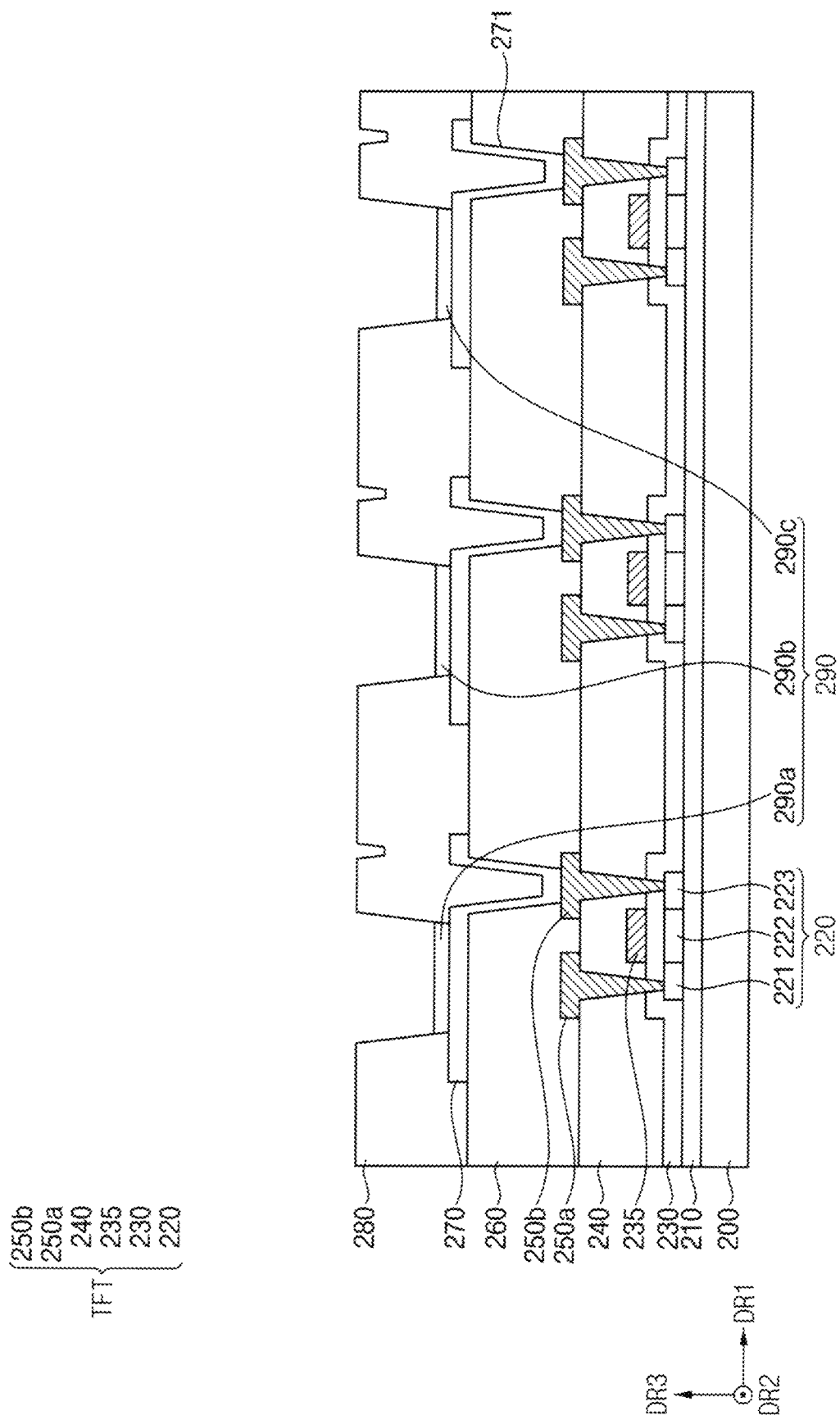

Referring to FIG. 11, the pixel defining layer 280 may be provided or formed on the lower electrode 270. an opening exposing at least a part of the lower electrode 270 may be formed through the pixel defining layer 280. In one embodiment, for example, the pixel defining layer 280 may be formed using an organic insulating material. In one embodiment, for example, the pixel defining layer 280 may be formed using a resin such as polyacrylic, polyimide, and the like. In an embodiment, the pixel defining layer 280 may be formed by further using a carbon black having a high light absorption rate.

Due to the via hole 271 formed in the via layer 260, the pixel defining layer 280 may have a step structure in a part thereof overlapping the via hole 271.

Figure 12:
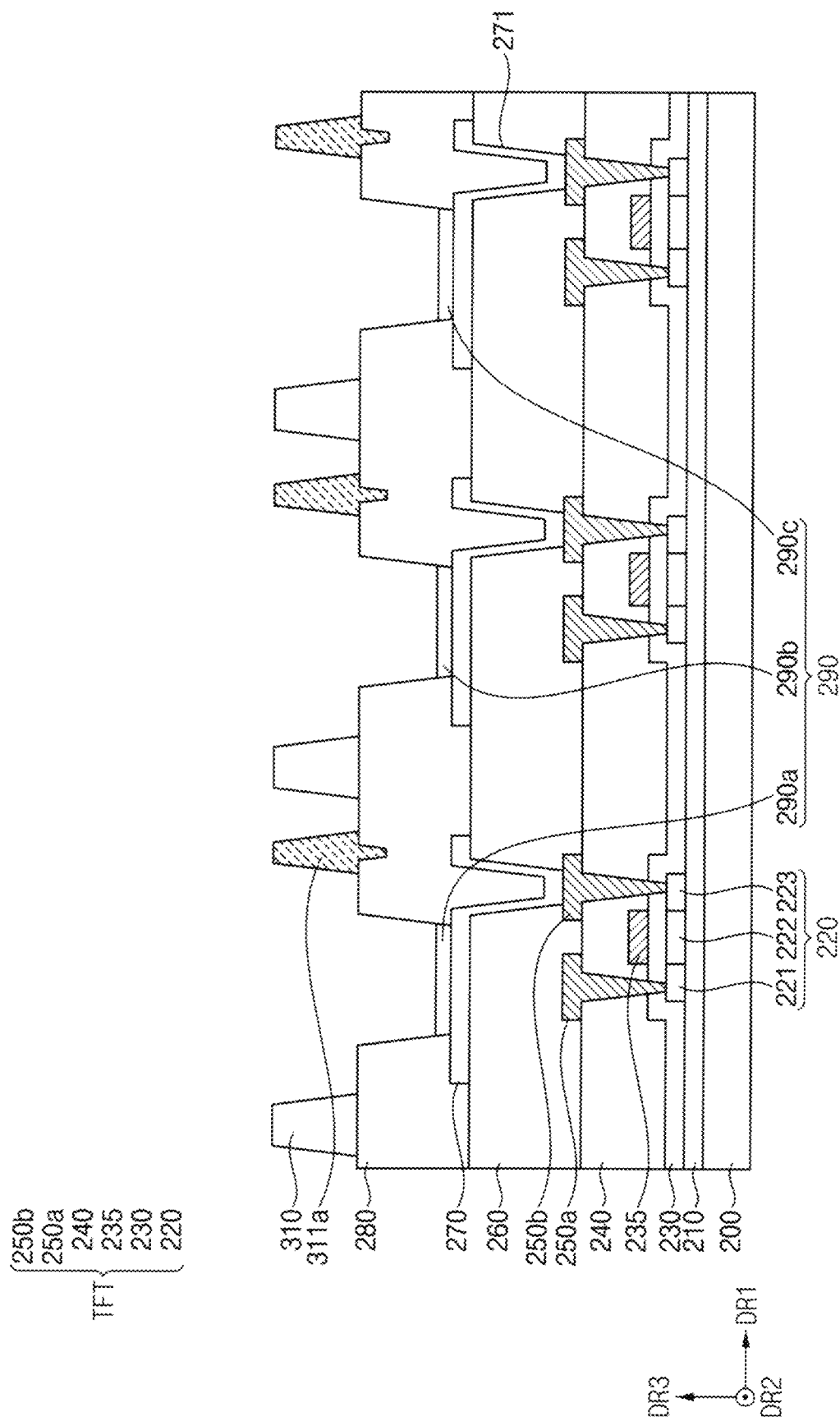

Referring to FIG. 12, the spacer 310 may be provided or formed on the pixel defining layer 280. In an embodiment, the spacer 310 may be formed in plural, and a plurality of spacers 310 may be formed on the pixel defining layer 280. The spacer 310 may serve to support collapse of a mask layer used when forming the light emission layer 290.

The transmission preventing pattern 311a overlapping the via hole 271 may be provided or formed on the pixel defining layer 280. In one embodiment, for example, the transmission preventing pattern 311a may be formed by filling the step structure of the pixel defining layer 280. Accordingly, the transmission preventing pattern 311a may reduce a reflected light caused by external light incident on the upper surface of the lower electrode 270.

In one embodiment, for example, the transmission preventing pattern 311a and the spacer 310 may be simultaneously formed using polyimide. In an embodiment, the transmission preventing pattern 311a and the spacer 310 may be formed at the same time or by a same process by further using a carbon black having a high light absorption rate.

In an embodiment, the transmission preventing pattern 311a may be formed on the pixel defining layer 280 so that the upper surface of the transmission preventing pattern 311a and the upper surface of the spacer 310 are positioned at the same level as each other. Alternatively, the transmission preventing pattern 311a may be formed on the pixel defining layer 280 so that the upper surface of the transmission preventing pattern 311a and the upper surface of the spacer 310 are positioned at different levels from each other.

In an embodiment, on a plan view, the transmission preventing pattern 311a and the spacer 310 may be formed in different shapes, respectively. In one embodiment, for example, the transmission preventing pattern 311a may be formed in a circular shape, and the spacer 310 may be formed in a rectangular shape. Alternatively, the transmission preventing pattern 311a and the spacer 310 may be formed in the same shape. However, the configuration of the invention is not limited thereto, and the transmission preventing pattern 311a and the spacer 310 may be formed in one of various shapes.

In an embodiment, a part of the spacer 310 and a part of the transmission preventing pattern 311a may be formed to be spaced apart without contacting each other. Alternatively, a part of the spacer 310 and a part of the transmission preventing pattern 311a may be formed in contact with each other.

The emission layer 290 may be provided or formed on the lower electrode 270. The emission layer 290 may include a hole injection layer, a hole transport layer, an organic emission layer, an electron transport layer, an electron injection layer, and the like. In one embodiment, for example, the emission layer 290 may be formed using a low molecular weight organic compound or a high molecular weight organic compound. In an embodiment, the emission layer 290 may include a first emission layer 290a for emitting red light, a second emission layer 290b for emitting green light, and a third emission layer 290c for emitting blue light.

Figure 13:
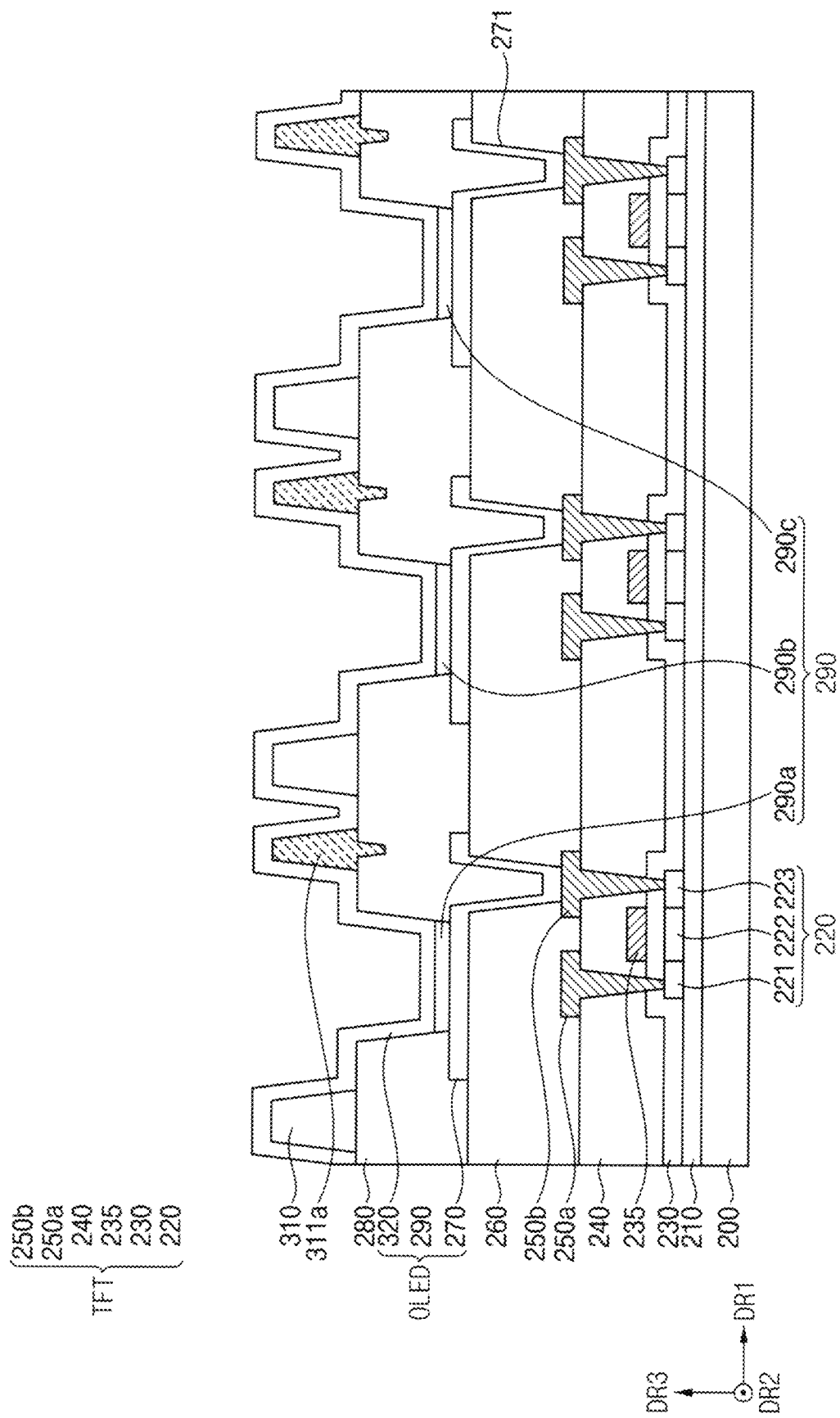

Referring to FIG. 13, the upper electrode 320 may be provided or formed on the emission layer 290, the pixel defining layer 280, the transmission preventing pattern 311a, and the spacer 310. The upper electrode 320 may be formed to cover the emission layer 290, the pixel defining layer 280, the transmission preventing pattern 311a, and the spacer 310 as a whole. The upper electrode 320 may continuously extend on the display area DA shown in FIG. 1.

Figure 14:
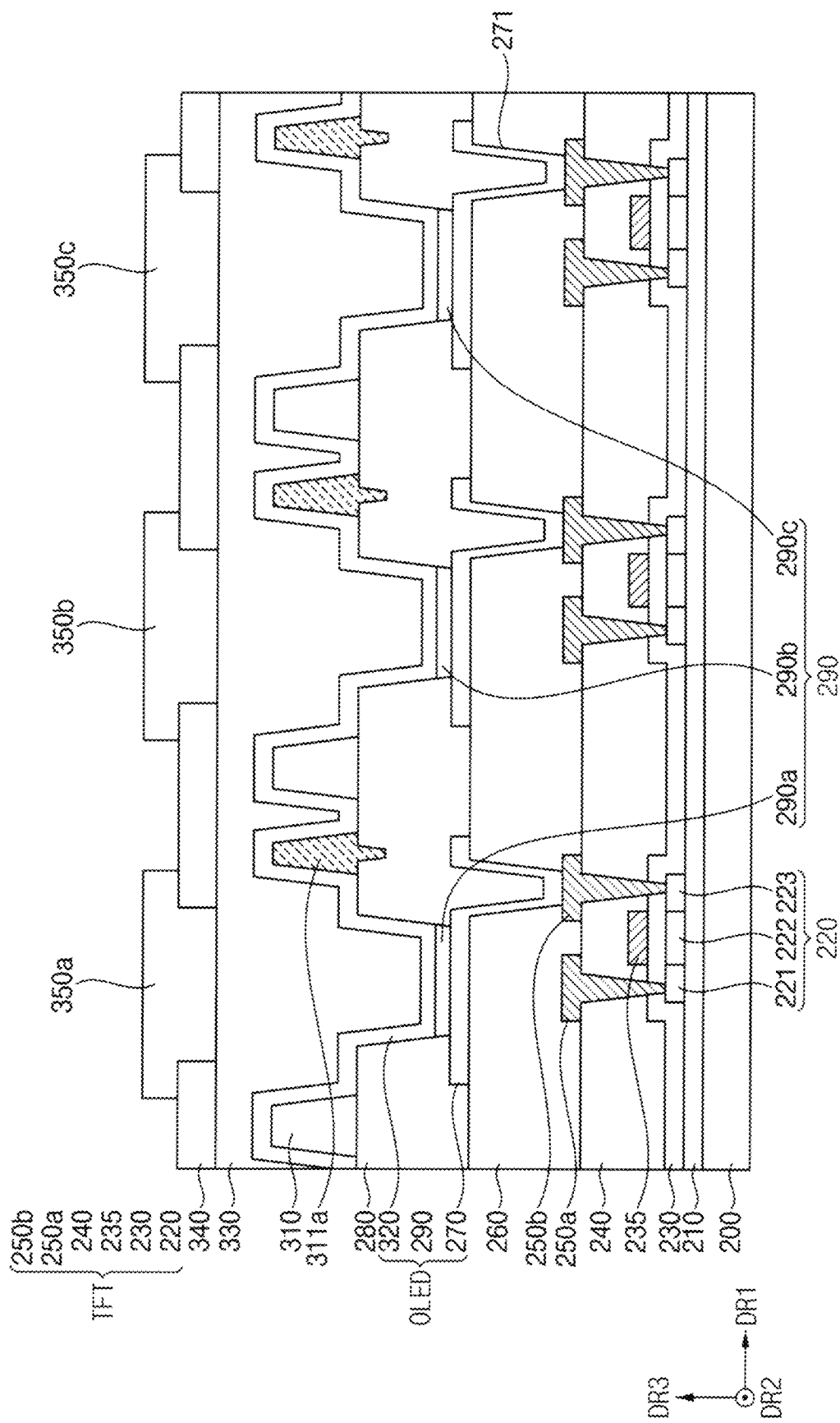

Referring to FIG. 14, the encapsulation layer 330 may be provided or formed on the upper electrode 320. In one embodiment, for example, the encapsulation layer 330 may have a laminated structure of an inorganic thin film and an organic thin film. The encapsulation layer 330 may prevent the organic light emitting element OLED from deteriorating due to penetration of moisture or oxygen. In addition, the encapsulation layer 330 may also perform a function of protecting the organic light emitting element OLED from external impact.

In one embodiment, for example, the organic thin film of the encapsulation layer 330 may be formed using a cured polymer such as polyacrylate, epoxy resin, silicone resin, and the like. In one embodiment, for example, the inorganic thin film of the encapsulation layer 330 may be formed using at least one selected from silicon oxide, silicon nitride, silicon carbide, aluminum oxide, tantalum oxide, hafnium oxide, zirconium oxide, titanium oxide, and the like.

The black matrix 340 may be provided or formed on the encapsulation layer 330. The black matrix 340 may be disposed to correspond to a non-emission area of the display device 100. In an embodiment, a plurality of openings corresponding to the emission layer 290 may be formed through the black matrix 340. In one embodiment, for example, the black matrix 340 may prevent visible rays of different colors implemented in the organic light emitting element OLED from abnormally mixing or affecting each other. In addition, the black matrix 340 may prevent members of the thin film transistor TFT from being damaged by external light.

In an embodiment, the black matrix 340 may be formed using at least one of various materials. In one embodiment, for example, the black matrix 340 may be formed using a black organic material mixed with a black pigment or chromium oxide.

The plurality of color filters 350a, 350b, and 350c may be provided or formed in the openings formed by the black matrix 340. A part of each of the plurality of color filters 350a, 350b, and 350c may overlap a part of the black matrix 340. However, the configuration of the invention is not limited thereto, and the plurality of color filters 350a, 350b, 350c may be formed so that a thickness of each of the plurality of color filters 350a, 350b, and 350c and a thickness of the black matrix 340 are the same as each other.

In one embodiment, for example, the plurality of color filters 350a, 350b, and 350c may include a coloring material and an organic material in which the coloring material is dispersed. The coloring material may be a general pigment or dye, and the organic material may be a common dispersing agent. The plurality of color filters 350a, 350b, and 350c selectively pass only light of a specific wavelength, for example, red, green, or blue among the light emitted from the display device 100, and absorb lights of the remaining wavelengths, thereby allowing one of red, green, and blue lights to be emitted from the organic light emitting element OLED. The plurality of color filters 350a, 350b, and 350c include the first color filter 350a that has a red color and overlaps the first emission layer 290a, the second color filter 350b that has a green color and overlaps the second emission layer 290b, and the third color filter 350c that has a blue color and overlaps the third emission layer 290c, such that a light emitted from the first, second, and third emission layers 290a, 290b, and 290c may be visually recognized as red, green, and blue colors.

Although not shown in FIG. 14, the overcoat layer 360 (shown in FIG. 3) may be provided or formed on the plurality of color filters 350a, 350b, and 350c. The overcoat layer 360 may cover the plurality of color filters 350a, 350b, and 350c. The overcoat layer 360 may prevent the plurality of color filters 350a, 350b, and 350c from being exposed from external moisture or air. In addition, the overcoat layer 360 may function as a planarization layer. In one embodiment, for example, the overcoat layer 360 may be formed using an organic material or an inorganic material.

In an embodiment, although not shown in FIG. 14, the touch sensing structure TP (shown in FIG. 2) may be provided or formed on the overcoat layer 360, and the cover window WD (shown in FIG. 2) may be provided or formed on the touch sensing structure TP.

Accordingly, the display device 100 shown in FIG. 3 may be manufactured as described above.

Embodiments of the invention may be applied to various display devices including a display device, such as display devices for vehicles, ships and aircraft, portable communication devices, display devices for exhibition or information transmission, and medical display devices, for example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims art.

What is claimed is:

1. A display device comprising:
   a substrate including a display area;
   a thin film transistor disposed on the substrate;
   a via layer disposed on the thin film transistor, wherein a via hole is defined through the via layer to expose a part of the thin film transistor;
   a lower electrode disposed on the via layer;
   a pixel defining layer disposed on the via layer, wherein a step structure is defined in the pixel defining layer to overlap the via hole; and
   a transmission preventing pattern disposed directly on the step structure of the pixel defining layer, and overlapping the via hole.

2. The display device of claim 1, further comprising:
   a spacer disposed on the pixel defining layer.

3. The display device of claim 2, wherein
   a thickness of the transmission preventing pattern is different from a thickness of the spacer, and
   the transmission preventing pattern fills the step structure when viewed in a cross-sectional view.

4. The display device of claim 2, wherein
   an upper surface of the transmission preventing pattern and an upper surface of the spacer are positioned at a same level as each other, and
   the transmission preventing pattern fills the step structure when viewed in a cross-sectional view.

5. The display device of claim 2, wherein the transmission preventing pattern and the spacer include a same material as each other.

6. The display device of claim 5, wherein each of the transmission preventing pattern and the spacer includes a carbon black.

7. The display device of claim 1, wherein the pixel defining layer and the transmission preventing pattern include a same material as each other.

8. The display device of claim 7, wherein each of the pixel defining layer and the transmission preventing pattern includes a carbon black.

9. The display device of claim 1, wherein the thin film transistor includes:
   an active layer;
   a gate insulating layer disposed on the active layer;
   a gate electrode disposed on the gate insulating layer;
   an interlayer insulating layer disposed on the gate electrode; and
   a source electrode and a drain electrode disposed on the gate electrode.

10. The display device of claim 9, wherein
    the via hole exposes a part of the drain electrode, and
    the lower electrode extends from an upper surface of the via layer into the via hole, and is in contact with the drain electrode.

11. The display device of claim 9, wherein the via layer includes:
    a first via layer disposed on the interlayer insulating layer, and covering the source electrode and the drain electrode; and
    a second via layer disposed on the first via layer.

12. The display device of claim 1, further comprising:
    an emission layer disposed on the lower electrode; and
    an upper electrode disposed on the transmission preventing pattern, the pixel definition layer, and the emission layer.

13. The display device of claim 12, wherein the via hole and the emission layer are spaced apart from each other.

14. The display device of claim 12, further comprising:
    an encapsulation layer disposed on the upper electrode; and
    a black matrix disposed on the encapsulation layer, wherein a plurality of openings is defined through the black matrix.

15. The display device of claim 14, further comprising:
    a plurality of color filters disposed in the openings of the black matrix.

* * * * *